Figure 1:
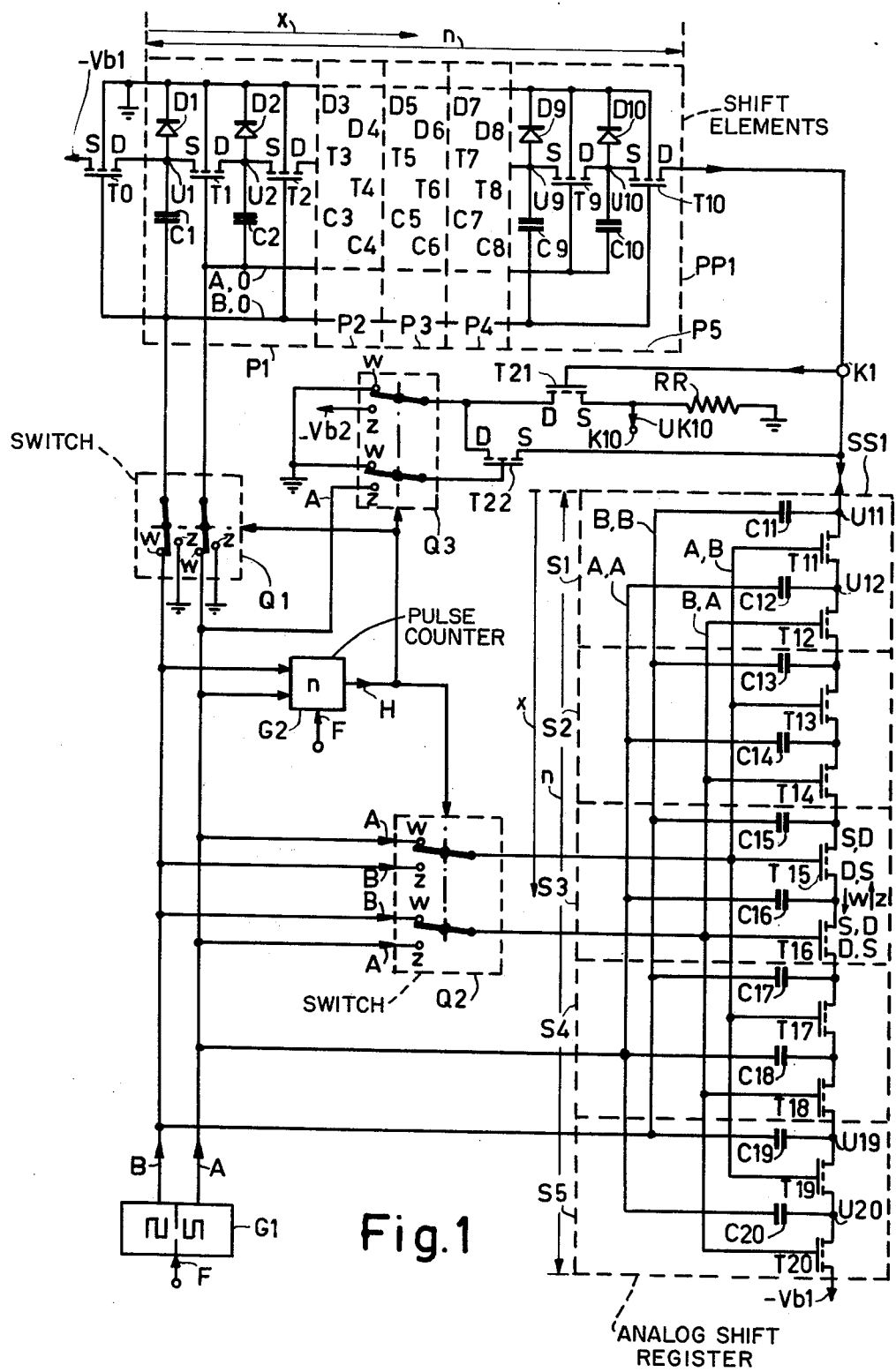

United States Patent [19]
Teer et al.

[11] 3,967,055
[45] June 29, 1976

[54] CHARGE TRANSFER IMAGING DEVICE

[75] Inventors: Kees Teer; Frederik Leonard Johan Sangster, both of Eindhoven, Netherlands

[73] Assignee: U.S. Philips Corporation, New York, N.Y.

[22] Filed: Aug. 14, 1974

[21] Appl. No.: 497,472

[30] Foreign Application Priority Data
Aug. 20, 1973   Netherlands................. 7311429

[52] U.S. Cl................ 178/7.1; 250/211 R; 250/211 J; 357/30
[51] Int. Cl.²............ H04N 5/30; H01L 27/14
[58] Field of Search............ 178/7.1, DIG. 12; 250/211 R, 211 J; 357/24, 26–30; 235/193

[56] References Cited
UNITED STATES PATENTS

| | | | |
|---|---|---|---|
| 3,603,731 | 9/1971 | Weimer | 178/7.1 R |
| 3,683,193 | 8/1972 | Weimer | 178/7.1 X |
| 3,696,250 | 10/1972 | Weimer | 178/7.1 X |
| 3,789,247 | 1/1974 | Beausoleil et al. | 307/221 C |
| 3,801,884 | 4/1974 | Sequin | 357/30 |
| 3,824,337 | 7/1974 | Sangster et al. | 178/7.1 |
| R27,951 | 3/1974 | Teer et al. | 178/7.1 |

OTHER PUBLICATIONS

Garner: State of Solid State (CCD & Image Sensor), Radio Electronics, Aug. 1973, pp. 56/57.

*Primary Examiner*—Felix D. Gruber
*Attorney, Agent, or Firm*—Frank R. Trifari; Daniel R. McGlynn

[57] ABSTRACT

A semiconductor pick-up arrangement in which the picked up information is transported through a series of shift elements to an output. Since each information passes another number of shift elements in which the passage of a signal per switching operation is non-ideal, there is a place or time-dependent signal degradation. To obtain a uniform signal degradation the information is applied to an analog shift register of a forward and backward shifting type in which the signal degradation per switching operation at the shift register has been reduced by approximately 50% of that at the series.

10 Claims, 5 Drawing Figures

CHARGE TRANSFER IMAGING DEVICE

CROSS REFERENCE TO RELATED APPLICATIONS

U.S. Pat. No. Re 27,951, issued Mar. 26, 1974, to the same co-inventors, and assigned to the same party.

The invention relates to a pick-up arrangement formed with information pick-up areas in a semiconductor body in which the picked up information can be shifted via charge transfer through a series of shift elements under the control of a clock pulse source to an output of the series.

The information is, for example, optical effects which influence for a given time the voltage across a photosensitive capacitor present at the pick-up areas of the shift elements. Subsequently the charge shortages at the pick-up areas determined by the information which is locally present are transferred within a relatively short time through the series of shift elements to the output.

Shifting through the series causes the information of a pick-up area which is located more closely to the output of the series than another to pass a smaller number of shift elements. This would not be disturbing when there was a more or less ideal charge transfer during shifting. Charge transfer is, however, not ideal in practice so that a signal degradation occurs in the signal at the output of the series, which degradation is dependent on the number of shifts, i.e. it is place and time-dependent. Dependent on the larger number of shifts there is a further bandwidth limitation and a smaller signal-to-noise ratio while charge losses occurring during shifting result in a varying direct current or direct voltage shift in the output signal associated with the series.

An object of the invention is to provide a pick-up arrangement with which an output signal is generated which does not have the described disturbing signal degradation. To this end a pick-up arrangement according to the invention is characterized in that the output of the series of shift elements is connected to an input of an analog shift register for picking up said information in register elements, which shift register is of the forward and backward shifting type successively picking up and shifting back information under the control of the clock pulse source, the signal degradation occurring during shifting in the shift elements of the series and that occurring in the register elements of the shift register having a ratio at which the supplied signal at the output of the shift register has essentially a uniform signal degradation which is independent of place and time.

Figure 2:
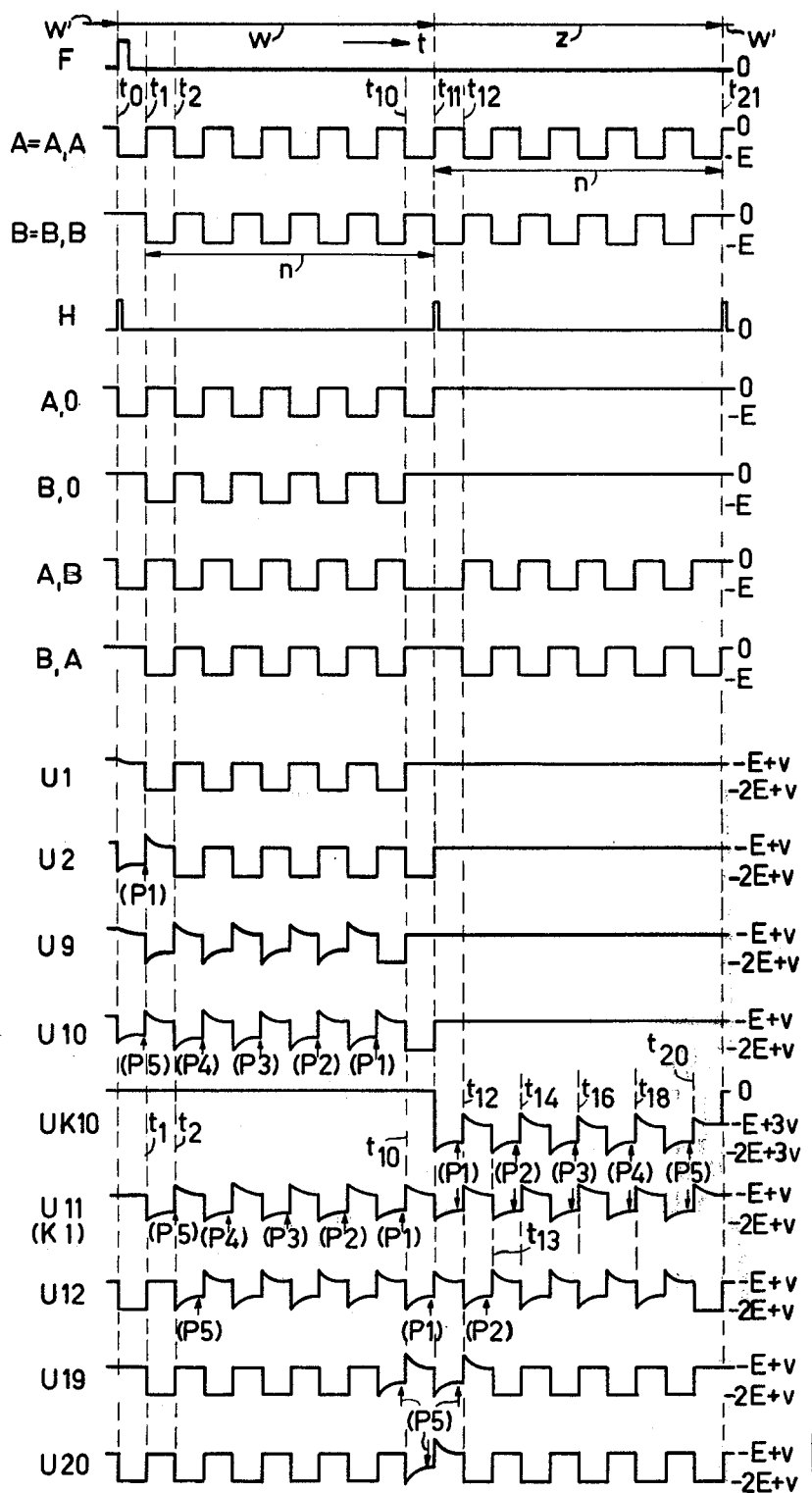
Figure 3:
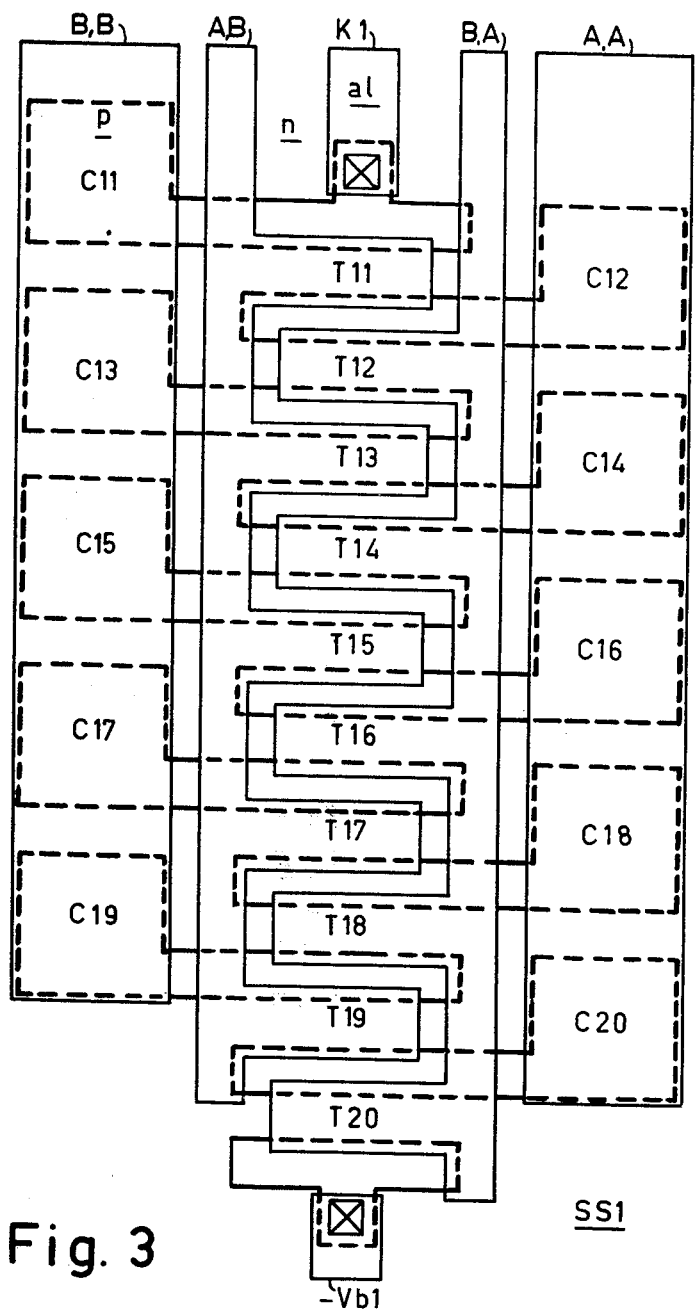
Figure 4:
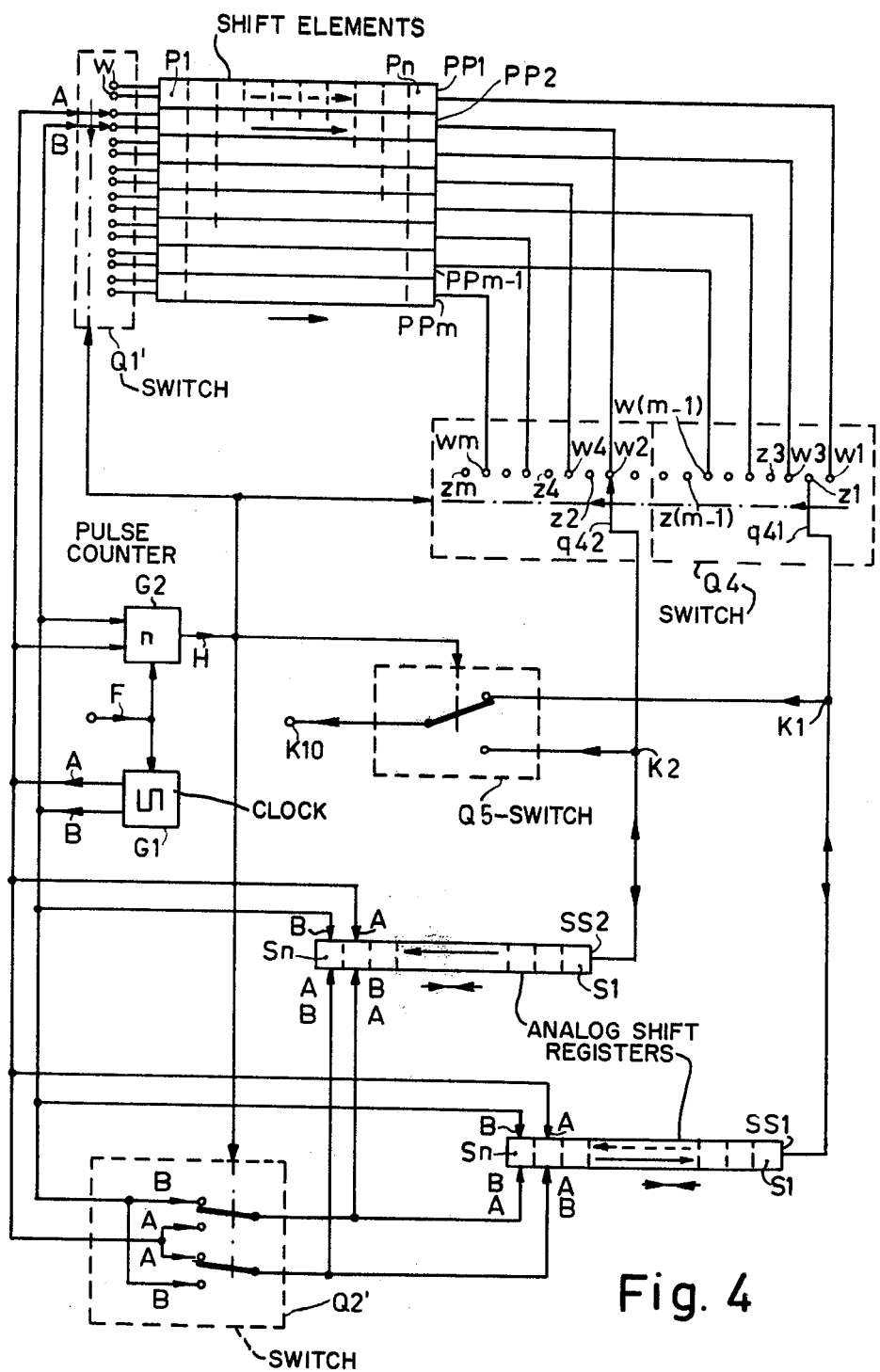
Figure 5:
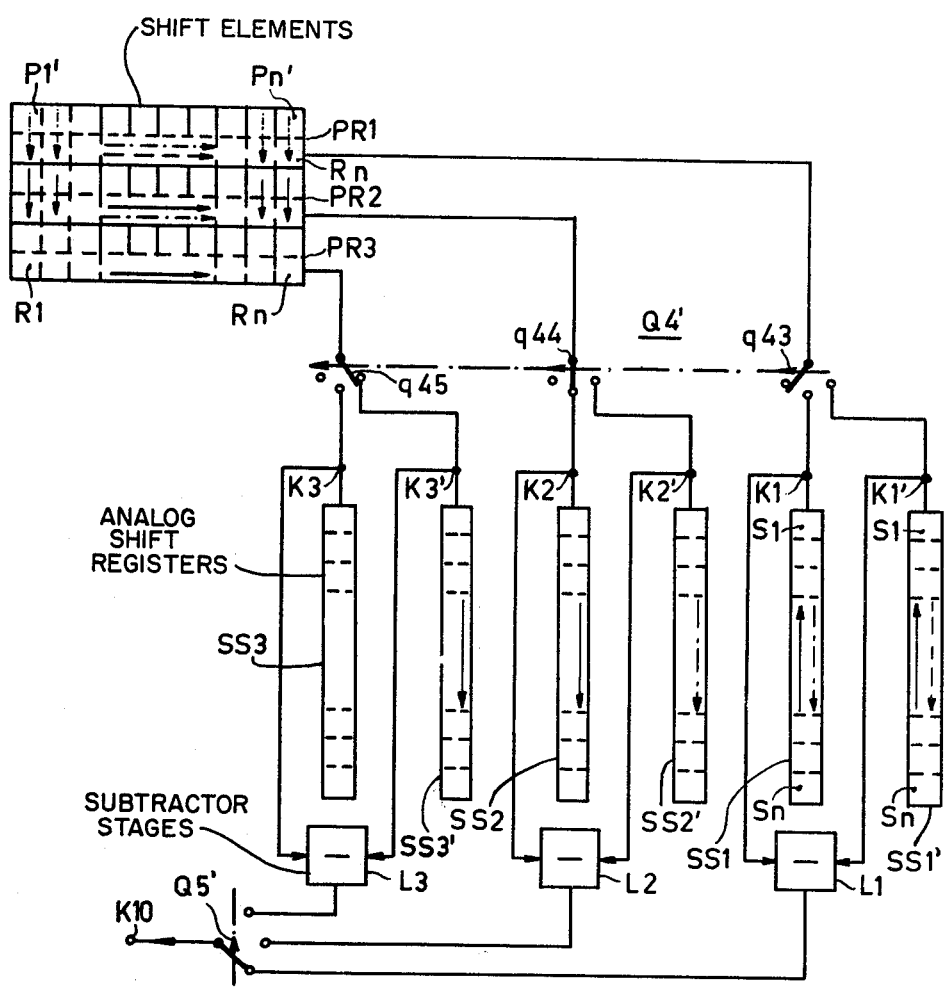

The invention will be described in greater detail by way of example with reference to the following Figures in which FIG. 1 shows a pick-up arrangement according to the invention formed with a single series of shift elements with pick-up areas, FIG. 2 shows as a function of time some signals occurring in the pick-up arrangement according to FIG. 1, FIG. 3 shows an embodiment integrated in a semiconductor body of an analog shift register of the forward and backward shift type used in the arrangement according to FIG. 1, FIG. 4 shows a pick-up arrangement having a plurality of series of shift elements with pick-up areas which are consecutively controlled, FIG. 5 shows a pick-up arrangement having a plurality of series of shift elements with separate pick-up areas.

In the pick-up arrangement according to FIG. 1 the reference PP1 denotes a series of $n$ shift elements with pick-up areas. The elements of the series PP1 are denoted by P1, P2 ... P5 so that $n = 5$ in FIG. 1. Furthermore the third element P3 is denoted by $x$, where generally $x = 1, 2, 3 ... n$. The elements P1 ... P5 are identical and each have two transistors T1, T2 ... T9, T10, two capacitors C1, C2 ... C9, C10 and two diodes D1, D2 ... D9, D10. The element P1 of the series PP1 is connected through a transistor T0 to a terminal conveying a voltage $-V_{b1}$ which originates from a voltage source not shown having a terminal connected to ground and possible other terminals conveying other voltages. The transistors T are of the type having an isolated gate electrode and have a source S, a drain D and a substrate not further shown which is connected to ground. Of the respective transistors T0, T1 ... T9 the drains D are connected to the sources S of the respective transistors T1, ... T10. In the embodiment of the series PP1 and the transistor T0 in one semiconductor body as a substrate this means that the drain D of a transistor and the source S of the subsequent transistor are constituted as a single region (D+S) in the substrate.

Since the elements P1 ... P5 are essentially identical, only the element P1, need be described in detail. The drain D of the transistor T1 and the source S of the transistor T2 are connected through the diode D2 to the substrate and their capacitor C2 is connected to the gate electrode of the transistor T1. The source S of the transistor T1 (which is furthermore connected to the drain D of the transistor T0) has its diode D1 connected to the substrate and the capacitor C1 connected to the gate electrode of the transistor T2 (and to that of the transistor T0). For the connections between the elements P1, ... P5 there applies that outside the common substrate the gate electrodes of the transistors T1, T3, T5, T7 and T9 and T2, T4, T6, T8 and T10 are interconnected. Since the cathodes of the diodes D1 .. . D10 are shown as being connected to the substrate, it follows that the regions (D + S) of p semiconductor material are formed in a substrate of $n$ semiconductor material. The transistors T are therefore of the $p$-channel type only having a hole current from the source S to the drain D of a transistor. The diodes D1 ... D10 are constituted by the region substrate semiconductor junctions which are photosensitive which means that a (reference) cut-off voltage present across a diode D1 ... D10 is reduced by hole electron pairs produced under the influence of photons in and near the semiconductor junction. The diodes D1 ... D10 are therefore to be considered as photosensitive capacitors which, charged to the reference voltage, undergo a determined discharge under the influence of the incident photons. The diodes D1 ... D10 are the pick-up areas in the series PP1. The capacitors C1 ... C10 are present between the gate electrodes of the transistors T which are provided in an isolated manner on the semiconductor body and the regions (D + S) in the semiconductor body as a substrate.

For the control of the series PP1 the pick-up arrangement according to FIG. 1 is provided with a clock pulse source G1 connected thereto through a switch Q1. A signal F which is shown as a function of time $t$ with instants $t_0, t_1, t_2 \ldots t_{21}$ in FIG. 2 is applied to the clock pulse source G1. At the instant $t_0$ a pulse occurs in the signal F, which pulse activates the source G1 for the period until the instant $t_{21}$ for supplying a signal A and a signal B which in FIG. 2 are plotted as the signals A = A,A and B = B,B with clock pulses between the ground potential 0 and a voltage $-E$. The signals A and B are applied in FIG. 1 to a pulse counter G2 to which likewise the signal F is applied. After the starting pulse in the signal F ($t_0$) the pulse counter G2 is activated with a counting number $n$ and supplies pulses shown as a signal H in FIG. 2 after $n$ clock pulses in the signal B ($t_{11}$) and subsequently after $n$ clock pulses in the signal A ($t_{21}$). The signal H which is generated by the pulse counter G2 is applied as a switching signal, as shown in FIG. 1, to the switch Q1. The switch Q1 has two change-over switches each having a master contact connected to the series PP1 and two selection contacts denoted by $w$ and $z$. The selection contacts $w$ are connected to the two outputs of source G1, while the selection contacts $z$ are connected to ground. In FIG. 2 two periods ($t_0$ to $t_{11}$ and $t_{11}$ to $t_{21}$) are denoted by $w$ and $z$ in which the change-over switches in the switch Q1 are connected to the selection contacts $w$ and $z$, respectively. It is found that the gate electrodes of the transistors T1, T3, T5, T7 and T9 receive the clock pulses of the signal A during the period $w$ and are connected to ground during the period $z$; in FIG. 2 the resulting signal A,O is plotted. In the same way the gate electrodes of the transistors T0, T2, T4. T6, T8 and T10 receive a signal B,O.

Before describing the signals at the series PP1 the further components of the pick-up arrangement according to FIG. 1 are shown which according to the invention are provided for performing a signal correction. The drain D of transistor T10 in the element P5 of the series PP1 is connected to a terminal K1. The terminal K1 is the output of the series PP1. Furthermore the terminal K1 permits application of the input of an analog shift register SS1 including register elements S1 . . . S5. Generally the shift register SS1 has $n$ register elements likewise as there are $n$ shift elements P1 etc. in the series PP1. The shift register SS1 is formed with ten transistors T11 . . . T20 connected in series to the terminal conveying the voltage $-Vb1$ and ten capacitors C11 . . . C20 connected to junctions in the series arrangement and each pairwise constituting the register elements S1 . . . S5. The transistors T11 . . . T20 are of the type having an isolated gate electrode. The connections shown at the series PP1 to the substrate are omitted in the register SS1 because they are irrelevant in this case. An essential difference is that there are four separate interconnections, namely between the capacitors C11, C13, C15, C17 and C19 and C12, C14, C16, C18 and C20 and the transistors T11, T13, T15, T17 and T19 and T12, T14, T16, T18 and T20, respectively. The interconnection of the even capacitors C12 . . . C20 is connected to the output of the clock pulse source G1 conveying the signal A (=A,A) while that of the odd capacitors C11 . . . C19 is connected to the output conveying the signal B (=B,B). The two separate interconnections of the odd and even transistors T11 . . . T20 are connected through a switch Q2 to the two outputs of the clock pulse source G1 conveying the signals A and B. The switch Q2 includes two change-over switches each having a master contact connected to the shift register SS1 and two selection contacts $w$ and $z$. In case of connection to the selection contacts $w$ the odd and even transistors T11 . . . T20 receive the signals A and B, respectively, and in case of the z-position they receive the signals B and A, respectively, as is shown in FIGS. 1 and 2 by the signals A, B and B, A. In addition to the switching signal H supplied by the pulse counter G2 being applied to the switch Q2, it is furthermore applied to a switch Q3. The switch Q3 includes two change-over switches each having two selection contacts $w$ and $z$ with the selection contacts $w$ connected to ground.

The selection contact $z$ of one of the change-over switches of the switch Q3 is connected to a terminal conveying a voltage $-Vb2$, while the master contact is connected to the drain D of a transistor T21 whose isolating gate electrode is connected to the terminal K1 and whose source S is connected to ground through a resistor RR. The source S of the transistor T21 is connected to a terminal K10 which is the output of the pick-up arrangement according to FIG. 1 and which conveys an output signal UK10. The transistor T21 cannot conduct in the $w$ position of the switch Q3 so that the ground potential 0 occurs in the output signal UK10 at the output terminal K10. In the $z$ position of the switch Q3 the transistor T21 is active as a source follower for a signal occurring at the gate electrode.

The selection contact $z$ of the second change-over switch in the switch Q3 is connected to the output of the clock pulse source G1 conveying the signal A. The master contact is connected to the gate electrode of a transistor T22 whose drain D is connected to the master contact of the first change-over switch and whose source S is connected to the junction of capacitor C11 and transistor T11. In the $w$ position of the switch Q3 the transistor T22 is cut off because the ground potential is present at the drain D and the gate electrode, while only negative voltages may occur at the source S. In the $z$ position the transistor T22 will start to conduct a hole current when the voltage at the source S is less negative than that at the gate electrode plus the gate-source threshold voltage.

The switches Q1, Q2 and Q3 are shown for the sake of simplicity in FIG. 1 as mechanical switches, but in practice they will be formed with electronic components.

To explain the operation of the pick-up arrangement according to FIG. 1, FIGS. 1 and 2 show some signals U1, U2, U9 and U10 occurring in the series PP1 and some signals U11, U12, U19 and U20 occurring in the shift register SS1. The signals U1 . . . U20 give the voltages which occur at the connections of the capacitors C1 . . . C20 connected to the transistors T. The signals U1 . . . U20 in FIG. 2 are shown diagrammatically, while for the sake of simplicity a pre-charge which is commonly used in practice is not taken into account and which is shifted in the series PP1 and the register SS1 and is supplied by the voltage $-Vb1$. For explaining the invention such a pre-charge which is used for obtaining a more efficient switching at the transistors T is irrelevant.

The starting point will be an instant located shortly before the instant $t_0$ shown in FIG. 2. This instant occurs at the end of a period denoted by $w'$ in FIG. 2. The period $w'$ is assumed to be much larger than the periods $w$ and $z$. During the period $w'$ a clock pulse source G1 does not give any clock pulses in the signals A and B, but the ground potential 0 occurs therein, which likewise applies to the signals A,0; B,0; A,B and B,A. In case of periodical operation of the pick-up arrangement the instant of commencement of the period $w'$ is the instant $t_{21}$ then occurring periodically; all instants shown in FIG. 2 then occur periodically. FIG. 2 shows that after the instant $t_{21}$ the signals U1 ... U20 have a voltage $-E + v$. This voltage is a reference voltage given by the negative clock pulse voltage $-E$ reduced by the gate-source threshold voltage ($v$) of the transistor T. The threshold voltage $v$ occurs in a transistor T which does not convey current (any longer) but is biassed to conduct. The reference voltage $-E + v$ occurs across the capacitors C in the series PP1 and the shift register SS1, but in the series PP1 the voltage is also present across the photosensitive diodes D1 ... D10. The photons of the light incident during the relatively long period $w'$ on the pick-up areas with the blocked diodes D1 ... D10 give a less negative voltage due to the discharge in the signals U1 ... U10. An equal uniform exposure on the series PP1 is the starting point so that just before the instant $t_0$ the voltage in the signals U1 ... U10 has become less negative by an equally large amount for all signals than the reference voltage $-E + v$. For the shift register SS1 there applies that before the instant $t_0$ during the entire period $w'$ the reference voltage $-E + v$ is present in the signals U11 ... U20. To prevent light from being incident on the shift register SS1 which may result in an unwanted leakage at the voltages U11 ... U20, it may be shielded from the light; for the signal processing according to the invention this is, however, not essential because FIG. 2 will show that the influence of leakage is locally eliminated and a reference voltage is obtained before signal processing commences at that area.

As from the instant $t_0$ to the instant $t_1$ the negative voltage $-E$ occurs in the signals A = A,A; A,O and A,B. The voltage $-E$ in the signal A,O occurs at the gate electrodes of the transistors T1, T3, T5, T7 and T9 while the voltage $-E$ at the drains D is added to the negative voltage present across the capacitors C2, C4, C6, C8 and C10. FIG. 2 shows the voltage step of the magnitude $-E$ at the instant $t_0$ at the signals U2 and U10. The voltage $-E$ at the gate electrodes of the transistors T1, T3, T5, T7 and T9 causes a voltage to occur at the sources S which is not less negative than $-E + v$, and a hole current will flow from the source S to the drain D until this condition ($-E + v$) is achieved. FIG. 2 shows the effect of the hole current between the instants $t_0$ and $t_1$ at the signals U1 and U9. The hole current furthermore results in the voltage in the signals U2 and U10 becoming equally less negative. Before the instant $t_1$, a voltage occurs in the signals U2 and U10 which, relative to the voltage $-2E + v$, gives information on the leakage which is determined by the incident photons at the pick-up areas on diodes D1 and D2 and D9 and D10. FIG. 2 shows at the signals U2 and U10 that before the instant $t_1$ the added information (P1) and (P5) in the elements P1 and P5, respectively, is available for further shifting to the output terminal K1.

The signals U11, U12, U19 and U20 of FIG. 2 show between the instants $t_0$ and $t_1$ the voltages as they occur when during the period $w'$ no leakage has occurred in the elements S1 and S5 and no hole current will flow.

As from the instant $t_1$ to the instant $t_2$ the voltage $-E$ occurs and the signals B = B,B; B,O and B,A while the ground potential 0 is now present in the signals A = A,A; A,O and A,B. The even transistors T0, T2 ... T20 may become conducting with a hole current, while at the instant $t_1$ a voltage step E occurs in all signals U1 ... U20 which is negatively directed for the odd signals and positively for the even signals. At the instant $t_1$ a shift of the added information is effected from one element P of the series PP1 to the next element P. The information (P5) in the signal U10 of FIG. 2 is shifted at the instant $t_1$ to the output terminal K1 when the signal U11 of FIG. 2 occurs, thus with the information (P5) before the instant $t_2$.

At the instant $t_2$ shifting is effected in the shift elements P and the register element S so that after the instant $t_2$ the information (P4) occurs in the signal U10, while the information (P5) appears in the signal U12.

In the manner described further information (P3), (P2) and (P1) follows in the signal U10 and information (P4), (P3), (P2) and (P1) follows in the signal U11. Before the instant $t_{10}$ the information (P5) occurs in the signal U19 which subsequently occurs after the instant $t_{10}$ in the signal U20. Before the instant $t_{11}$ the information (P1), (P2), (P3), (P4) and (P5) is present in the signals U12, U14, U16, U18 and U20 of the shift register SS1.

At the instant $t_{11}$ the switches Q1, Q2 and Q3 are set to the z-position by the switching signal H. The control of the series PP1 is stopped through the switch Q1 and as from the instant $t_{11}$ the ground potential 0 remains present in the signals A,O and B,O during the periods z and w. As from the instant $t_{11}$ the negative reference voltage $-E + v$ occurs in all signals U1 ... U10, which negative voltage can decrease during the periods z and w as a function of the photons incident on the pick-up areas with the diodes D1 ... D10. Since the period z is much shorter than the period w, it may be assumed that the reference voltage $-E + v$ still occurs in the signals U1 ... U10 at the instant $t_{21}$, which situation has been used as a starting point in the foregoing.

The change-over of the switch Q3 to the selection contact z conveying the voltage $-Vb2$ activates the transistor $t_{21}$ as a source follower, which means that the voltage at the terminal K10 is approximately $2v$ less negative in threshold voltage than the voltage occurring at the gate electrode. The gate-source threshold voltage of a current conductor transistor T with an isolated gate electrode has approximately the double value of that ($v$) occurring in a transistor T biassed to conduction but not conveying current (any longer). Furthermore the transistor T22 is released through the switch Q3 so as to become conducting, if necessary, under the control of the signal A, which is dependent on the voltage at the source S.

The change-over in the switch Q2 results in the direction of the signal shift in the register SS1 being reversed. It is indicated at the register element S3 that during the described period w the transistor T15 has a drain D which is connected to a source S of the transistor T16. It follows from the foregoing that a hole current can occur in each transistor T from its source S to its drain D under the control of the signals A and B, respectively, at the gate electrodes of the odd and even transistors T11 ... T20. For the register element S3 the direction of the hole current is indicated by an arrow w. By applying during the period z in a reversed manner the signals B and A to the gate electrodes of the odd and even transistors T11 ... T20, respectively, the hole current will reverse its direction in each transistor T with a source S becoming a drain D. In the register element S3 the reverse direction of the hole current is indicated by an arrow z. The terminal K1 initially active as an input terminal for the shift register SS1 then becomes the output terminal.

At the instant $t_{11}$ the ground potential 0 occurs in the signal B,A so that the even transistors T12 ... T20 are cut off. Transistor T22 is also cut off by the ground potential 0 in the signal A applied thereto through the switch Q3. The voltage $-E$ then occurs in the signal A,B while the ground potential 0 appears in the signal A,A and the voltage $-E$ appears in the signal B,B so that the odd transistors T11 ... T19 can become conducting and a hole current flows from the even to the odd capacitors C20 ... C11. As a result the information (P5) present in the signal U20 of FIG. 2 is shifted back to the signal U19. Likewise the information (P1) in the signal U12 is shifted back to the signal U11. In the signal U11 the information (P1) is present relative to the reference voltage $-2E+v$ so that the information (P1) appears through the conducting transistor T21 in the signal UK10 relative to the reference voltage $-2E + 3v$. Before the instant $t_{12}$ the information (P1) is present in the signal UK10.

At the instant $t_{12}$ the voltage $-E$ appears in the signals B,A and A,A and the ground potential 0 appears in the signals A,B and B,B so that the even transistors T12 .. . T18 can become conducting for an information shift-back between the register elements S5, S4, S3, S2 and S1. It is indicated at the signal U12 of FIG. 2 that the information (P2) occurs therein. Furthermore due to the voltage $-E$ in the signal A at the gate electrode of the transistor T22 this transistor becomes conducting with a hole current until the voltage $-E+v$ is present in the voltage U11. Before the instant $t_{13}$ the voltage $-E + 3v$ occurs in the signal UK10.

At the instant $t_{13}$ the transmission of the information (P2) to the signal U11 commences and before the instant $t_{14}$ information (P2) is present in the two signals U11 and UK10. In the same manner the respective information (P3), (P4) and (P5) occurs before the instants $t_{16}$, $t_{18}$ and $t_{20}$ in the signal UK10 and the output K10 of the pick-up arrangement.

At the instant $t_{21}$ the pulse counter G2 supplies a pulse in the switching signal H so that the switches Q1, Q2 and Q3 are set to the $w$ position while by internal connections or by applying the signal H to the clock pulse source G1 this source discontinues the supply of clock pulses. The described period $w'$ for picking up information in the pick-up areas with the diodes D1 .. . D10 in the series PP1 then commences.

The operation of the pick-up arrangement according to FIG. 1 is described in the foregoing without dealing with its background which can now be explained in a simpler manner.

If the pick-up arrangement only comprised the series PP1 with shift elements P1 ... P5 and pick-up areas with diodes D1 ... D10 present therein, apart from an output stage and control means, an output signal would occur at the terminal K1 as is shown in FIG. 2 at the signal U11 in the period $w$. It is found that the information (P5) ... (P1) occurs successively at the terminal K1. The information (P5) becomes available after two transistors T9 and T10 are rendered conducting; in other words the information (P5) has undergone two switching operations. For the information (P1) there follows that it appears at the terminal K1 through ten transistors T1 ... T10 hence after ten switching operations. Generally there applies that for $n$ elements in the series PP1 the information of the element $x$, i.e. the information (Px) undergoes a number of $2(n+1-x)$ switching operations. If the switching operations were performed in an ideal manner, i.e. a charge transfer from one capacitor to the other without any loss of charge and switching of the transistors (T) without any signal influence, more or fewer switching operations for obtaining the information (Px) would not influence this. In practice the switching operations are not effected in an ideal manner but charge losses occur and switching influences the signal. A direct current or direct voltage shift occurs in the signal which increases with a larger number of switching operations which likewise results in a further bandwidth limitation and a smaller signal-to-noise ratio. In the output signal of the series PP1 a place or time-dependent signal degradation therefore occurs. Especially at large values of $n$, for example, $n = 100$ or more the resultant place or time-dependent signal degradation in the output signal is present in an unacceptable manner.

To eliminate the place or time-dependent signal degradation the pick-up arrangement according to FIG. 1 includes the shift register SS1 which is of the forward and backward shifting type. The information (Px) originating from the element Px in the series PP1 is applied, as described hereinbefore, to the register element Sx of the shift register SS1 and introduced therein as far as the even capacitor C. As a result the information (Px) undergoes a number of $(2x - 1)$ switching operations upon introduction into the shift register SS1. When shifting back, the same number of transistors T is passed in the shift register SS1 so that the information (Px) shifted back and present at the output terminal K1 of the shift register SS1 has undergone a number of 2 $(2x-1)$ switching operations in the shift register SS1.

Assuming that each switching operation in the series PP1 results in a signal degradation having a factor of $a$, while that in the shift register SS1 has a value of $b$, there follows that the total signal degradation at the output terminal K1 of the shift register SS1 is equal to $$2(n+1-x)a + 2(2x-1)b \qquad (1)$$

To realize that the signal degradation is place or time-independent, formula (1) must have a constant value independent of $x$ which applies to $$b = \tfrac{1}{2}a \qquad (2)$$

The requirement set in formula (2) that the signal degradation per switching operation at the shift register SS1 must be half that at the series PP1 can be satisfied by adaptation of the configuration of the capacitors C11 ... C20 and the transistors T11 ... T20 in the integrated form in a semiconductor body. For the series PP1 there applies that the configuration of the components present therein is for the greater part determined by the requirement of an optimum possible information pick-up in the pick-up areas with the diodes D1 ... D10. For the shift register SS1 such a requirement does not apply so that there is a degree of freedom to satisfy the requirement of half the signal degradation per switching operation.

Without the use of the shift register SS1 the information (P1) would have a signal degradation of $2na$ while that for the information (Pn) has the value $2a$. By using the shift register SS1 the place or time-dependent signal degradation is eliminated and there is a uniform signal degradation of $(2n+1)a$ for all information (Px).

The embodiment of the series PP1 shown in FIG. 1 is an example of how the information pick-up and shift might be effected in a semiconductor pick-up arrangement. Instead of a pick-up arrangement with the charge transfer through transistors formed in the substrate, a pick-up arrangement might be used which operates with the shift of a potential region under the surface of the substrate. Also in this case a place or time-dependent signal degradation occurs which can be eliminated in the manner described with reference to FIGS. 1 and 2 to a uniform signal degradation.

FIG. 3 shows an embodiment integrated in a semiconductor body of the analog shift register SS1 described with reference to FIG. 1. FIG. 3 is a plan view of the semiconductor body as a substrate which is made of $n$-type semiconductor material in which regions of $p$-type semiconductor material are formed by diffusion. An insulating coating not shown is provided on the substrate $n$ with the regions $p$ on which coating some leads of aluminium al are provided. At the area where the leads cover the $p$-regions (insulated therefrom) these regions are shown by broken lines. Two squares with diagonals indicate the connections to two $p$-regions to which the terminal K1 and the voltage $-Vb1$ can be connected through leads. The transistors T11 . . . T20 and capacitors C11 . . . C20 shown in FIG. 1 are also shown in FIG. 3. The transistors T are present between two adjacent $p$-regions and are controlled through two comb-shaped, meshing, but separately located leads to which the signals A,B and B,A are applied. The capacitors C are formed in two groups with even and odd numbers on either side and are present between a lead to which the signals B,B and A,A are applied and the $p$ region located underneath and insulated therefrom. The register elements S1 . . . S5 shown in FIG. 1 are not shown in FIG. 3, but are implied in this Figure.

For the shift register SS1 shown in FIG. 1 it is essential that there is no difference in the signal shift for the one and the other direction, which is realized with the structure of the shift register SS1 shown in FIG. 3.

FIG. 4 shows a pick-up arrangement with a plurality of series PP1, PP2 . . . PPm-1, PPm of shift elements P1 . . . Pn with pick-up areas controlled one after the other. Due to the bi-dimensional character of the pick-up arrangement according to FIG. 4 it is very suitable for television recording. Components already shown in FIG. 1 have the same reference numerals and to emphasize a modification they are provided with indices. For example, there is a switch Q1' through which series PP1 . . . PPm are controlled in a cycle. The starting point is that in a previous period $w$ the series PP1 is controlled for signal emission (broken-line arrow) while in the present period $w$ the series PP2 is controlled for signal emission (solid-line arrow). The $m$ outputs of the series PP1 . . . PPm are divided in two groups of odd and even series PP and the groups of outputs are connected to a switch Q4 having two change-over switches q41 and q42. The change-over switches q41 and q42 are controlled by the switching signal H and have selection contacts $w$ and $z$, the $w$ selection contacts being connected to the outputs of the series PP and the $z$ selection contacts being free. In the case shown where the series PP1 has been read and the series PP2 is being read, the change-over switch q41 is set to the selection contact $z1$ while the change-over switch q42 is set to the selection contact $w1$. The change-over switches q41 and q42 are each formed with $(m+1)$ selection contacts, the change-over switches q42 and q41 being set to a non-indicated contact when the change-over switch q41 is set to the contact $w1$ and the change-over switch q42 is set to the contact $zm$, respectively.

The master contact of the change-over switch q41 is connected to the terminal K1 which is connected to the analog shift register SS1. The master contact of the change-over switch q42 is connected to a terminal K2 which is connected to an analog shift register SS2 of the forward and backward shifting type. The shift registers SS1 and SS2 are directly controlled by the clock pulse source G1 conveying the signals A and B and through a switch Q2' so that when the signals B and A are instantaneously applied to certain inputs at the shift register SS1, the shift register SS2 receives the signals A and B at corresponding inputs and vice versa. It follows that whereas one shift register SS picks up information, the other shift register supplies information. In the case shown in FIG. 4 the shift register SS2 picks up the information of the series PP2 while simultaneously the shift register SS1 supplies the previously picked-up information of the series PP1.

The terminals K1 and K2 are connected to selection contacts of a switch Q5 whose master contact is connected to the output terminal K10 of the pick-up arrangement according to FIG. 4. The switch Q5 is controlled by the switching signal H and connects, in the case described, the terminal K1 to the output terminal K10 at which thus the information of the series PP1 becomes available. In one form of the shift registers SS1 and SS2 having a separate input and output the switch Q5 might be absent and the register outputs might be directly connected to the output K10. Here the requirement applies that in case of information at one register output the other register output must not convey any (interference) signal.

In case of information supply of the series PP3 the switch q41 will be set to the selection contact $w3$, the switch q42 to the selection contact $z2$ and the switch Q5 will be connected to the terminal K2 while the shift register SS2 will supply the information of the series PP2 and the shift register SS1 will pick up the information of the series PP3.

The relation given in formula (2) that the signal degradation per switching operation in the shift register SS1 of FIG. 1 must be half that at the series PP1 also applies to the shift registers SS1 and SS2 and the series PP1 . . . PPm.

FIG. 5 shows a pick-up arrangement which is formed with three series PR1, PR2 and PR3 each including shift elements R1 . . . Rn and separate pick-up areas P1' . . . Pn'. For the sake of simplicity the connections in FIG. 5 for the control of the various components have not been shown. As compared with the embodiment shown in FIG. 1 of the series PP1 in which the pick-up areas with the diodes D1 . . . D10 are always present in the manner shown upon shifting of the information, a structure in which the diodes are separated from the shift elements upon the shift of information might be considered for the series PR. The series PR thus consist of a shift register with the elements R1 . . . Rn to which the information of the pick-up areas P1' . . . Pn' is applied in parallel for a short time and which are subsequently shifted through the elements R1 . . . Rn when the pick-up areas P1' . . . Pn' are switched off.

The outputs of the series PR1, PR2 and PR3 are connected to a switch Q4' which is formed with three change-over switches q43, q44 and q45. The change-over switches q43, q44 and q45 are each formed with three selection contacts one of which is free and two of which are each connected to a shift register SS1, SS1'; SS2, SS2' and SS3, SS3', respectively. The shift registers SS, SS' are of the type having a terminal K, K' which may be both input and output and the terminals K1, K1'; K2, K2' and K3, K3' are connected to inputs of subtractor stages L1, L2 and L3, respectively. The outputs of the subtractor stages L are connected to selection contacts of a switch Q5' which is provided with a change-over switch whose master contact is connected to the output terminal K10 of the pick-up arrangement.

In addition to the possibility of performing the uniform signal degradation, the pick-up arrangement according to FIG. 5 provides a possibility of further signal correction. To this end the series PR1, PR2 and PR3 are read once without information being introduced from the pick-up areas P1' . . . Pn' and once with information. FIG. 5 shows by way of a solid-line arrow an instantaneous signal processing while a signal processing taking place in a previous period is denoted by a chain-link-line arrow and a signal processing in a period previous thereto is indicated by a broken-line arrow. For the series PR1 there follows that in the period prior to the previous period the elements R are read to the shift register SS1' (broken-line arrows). In the previous period the information is introduced from the pick-up areas P1' . . . Pn' into the elements R1 . . . Rn and applied through the switch q43 to the shift register SS1 while simultaneously the elements R of the series PR2 are read without information from the pick-up areas P' through the switch q44 to the shift register S2' (chain-link-line arrows). In the instantaneous period shown in FIG. 5 (solid-line arrows) the shift registers SS1 and SS1' are read to the subtractor stage L1 while simultaneously in the series PR2 the information from the pick-up areas P' is applied to the shift register SS2 and the elements R of the series PR3 are read without information from the pick-up areas P' to the shift register SS3. In case of cyclical operation the instantaneous period is the commencement of cycli of three periods. The subtractor stage L1 supplies a signal in the instantaneous period which has a uniform signal degradation, but also a signal correction because errors occurring upon reading the series PR1 at the shift elements R1 . . . Rn are eliminated by the signal subtraction.

The signal processing described with reference to FIG. 5 may likewise be used for the pick-up arrangement according to FIG. 4 with the essential difference that the series PP1 . . . PPm of FIG. 4 must first be read with information and subsequently once more (without the information already supplied). Also in this case there would be a cycle of three signal processing periods, and six shift registers SS, SS' would be required. When using the single series PP1 of FIG. 1 only two shift registers SS1 and SS1' would be necessary.

Instead of three subtractor stages L1, L2 and L3 and the switch Q5' one subtractor stage L might be used whose two inputs can be changed over for alternate connection to the terminals K1, K1'; K2, K2' and K3, K3' and whose output is directly connected to the output K10. In the embodiment of the shift registers SS and SS' with a separate input and output the six outputs might be connected in two groups to the two inputs of a subtractor stage L when it is ensured that with a signal at the two outputs there is no signal at the remaining four outputs of the shift registers SS and SS'.

What is claimed is:

1. A solid state photosensitive imaging array for detecting and shifting information by means of charge transfer comprising:
   a shift register having a plurality of elements having an output, comprising photosensing means and shift means for sensing and transferring information;
   a clock pulse means for providing clock pulses;
   an analog shift register having an input/output terminal connected to the output of said register elements; and
   control means responsive to said clock pulses for controlling the direction of shifting of said analog shift register.

2. An array as defined in claim 1, further comprising output control means, connected to the output of said register elements and said input/output of said analog shift register for controlling the output of said array.

3. An array as defined in claim 2, wherein said output control means comprise a first change-over switch responsive to said clock pulses.

4. An array as defined in claim 3, wherein said control means comprise a second change-over switch responsive to said clock pulses.

5. An array as defined in claim 1, further comprising a pulse counter connected to said clock pulse source for supplying a switching signal to said change-over switches, said pulse counter for counting up to the number of shift register elements.

6. An array as defined in claim 1, wherein said plurality of shift register elements are arranged in at least three series of shift elements, further comprising three change-over switches through which said series of shift registers are alternately connected to said output.

7. A solid state photosensitive imaging array for detecting and shifting information by means of charge transfer comprising:
   clock means for producing clock pulses;
   at least two series of shift elements comprising photosensing means and shift means for sensing and transferring information under control of said clock pulses;
   an analog shift register having an input/output terminal connected to the output of at least one series of said elements for transferring information under control of said clock means; and
   control means responsive to said clock pulses for controlling of said shift register.

8. A charge transfer imaging device comprising:
   a charge storage medium, comprising a substrate;
   a plurality of regions of semiconductor material formed on said substrate forming charge storage sites;
   a source of cyclically varying voltages; photosensitive means each associated with one of said charge storage sites and capable of modifying the charge stored therein upon responding to incident photons;
   means for transferring information between said charge storage sites; and
   means responsive to said cyclically varying voltages for controlling the direction of information transfer between said charge storage sites.

9. A device as defined in claim 8, further comprising two comb-shaped insulated leads situated in a slightly over lapping manner between said regions of said charge storage medium, thereby forming gate electrodes of a plurality of transistors thus formed.

10. A device as defined in claim 9, wherein said regions extend laterally beyond said comb-shaped leads for forming a capacitor.

* * * * *